United States Patent [19]

Kohayakawa

[11] Patent Number: 4,641,112
[45] Date of Patent: Feb. 3, 1987

[54] DELAY LINE DEVICE AND METHOD OF MAKING SAME

[75] Inventor: Masami Kohayakawa, Saitama, Japan

[73] Assignee: Toko, Inc., Tokyo, Japan

[21] Appl. No.: 836,099

[22] Filed: Mar. 4, 1986

[30] Foreign Application Priority Data

| Mar. 12, 1985 | [JP] | Japan | 60-35216[U] |
| Mar. 13, 1985 | [JP] | Japan | 60-49710 |
| Mar. 25, 1985 | [JP] | Japan | 60-42757[U] |
| Sep. 25, 1985 | [JP] | Japan | 60-146468[U] |
| Oct. 9, 1985 | [JP] | Japan | 60-154818[U] |
| Oct. 9, 1985 | [JP] | Japan | 60-225781 |
| Nov. 14, 1985 | [JP] | Japan | 60-175140[U] |

[51] Int. Cl.$^4$ .............. H03H 7/32; H03H 3/00; H05K 13/04
[52] U.S. Cl. .................. 333/140; 29/592 R; 29/832; 29/848; 333/138; 361/405; 361/421
[58] Field of Search .................. 333/138–140, 333/156, 185; 336/69, 192, 205; 361/392–397, 399–400, 404–406, 412, 421; 174/52 R, 52 FP, 52 PE, 52 S; 29/825, 827, 829, 832, 836, 842, 848, 592 R, 602 R, 831, 856, 844–846, 883

[56] References Cited

U.S. PATENT DOCUMENTS 3,602,846 8/1971 Hauser et al. .................. 333/140
4,506,238 3/1985 Endoh et al. .................. 333/138

FOREIGN PATENT DOCUMENTS 2219936 10/1973 Fed. Rep. of Germany ...... 333/139

Primary Examiner—Marvin L. Nussbaum

[57] ABSTRACT

In a lumped constant type delay line device, conductive plates provided with connecting portions and terminals are insert-molded with respect to a plastic base plate in such a manner that the connecting portions are exposed at one surface of the base plate and the terminals extend externally of the base plate. The delay line device further includes capacitors connected to the connecting portions of the conductive plates; and coils having taps connected to electrodes provided on cores and connected to the terminals of the conductive plates, the coils being mounted on the other surface of the base plate.

21 Claims, 18 Drawing Figures

DELAY LINE DEVICE AND METHOD OF MAKING SAME

BACKGROUND OF THE INVENTION

1. Field of the Invention

This invention relates to a delay line device which may be used for effecting timing-control, phase-correction and so forth with respect to circuits incorporated in electronic equipment, which handle digital signals, such as electronic computers, office-automation equipment or the like, and more particularly it pertains to a lumped constant type delay line device and method of making same.

2. Description of the Prior Art

In order to have a better understanding of the present invention, description will first be made of a conventional lumped constant type delay line device with reference to FIGS. 1 to 3 of the accompanying drawings. The conventional lumped constant type delay line device is constructed by using coils 10 and capacitors 20 as shown in FIG. 1.

FIG. 2 illustrates, by way of example, the construction of such conventional lumped constant type delay line device, prior to encapsulation with a plastic material. More specifically, in the illustrated construction, a plurality of capacitors 20 are soldered to wiring patterns printed on the bottom surface of a printed circuit board 30; a plastic sheet 40 formed with a plurality of apertures 42 is adhered to the top surface of the printed circuit board 30; and a plurality of coils 10 wound on cores 50 of a magnetic material such as, for example, ferrite, are positioned by the apertures 42 of the plastic sheet 40 and mounted on the top surface of the printed circuit board 30. Lead wire 12 of the coil 10a at the input end, lead wire 14 of the coil 10b at the output end, and taps 16 of the respective coils 10 are connected, by soldering, to the printed wiring patterns of the printed circuit board 30 and then to terminals 82 respectively.

In assembling such delay line device, it has heretofore been the practice to take the following procedures:

First, the coils 10 are successively wound onto the cores 50 while the taps 16 are being taken out, as shown in FIG. 3, and then each of the taps 16 is twisted and pre-soldered at the free end thereof. Meanwhile, the capacitors 20 are attached, by soldering, onto the bottom surface of the printed circuit board 30; the plastic sheet 40 is adhered to the top surface of the printed circuit board 3, with the apertures 42 thereof being located at the positions corresponding to the cores 50; and then the cores 50, which are coupled to each other through wires of the coils, are fitted in the respective apertures 42 and adhered to the top surface of the printed circuit board 30. Subsequently, the lead wires 12, 14 and taps 16 of the coils are led out and soldered to predetermined connection points in the printed wiring patterns.

Thereafter, the printed circuit board 30, which has the coils 10 and capacitors 20 mounted thereon, is placed in such a manner that the terminals 82 can be held between two rows of lead frames, and the printed wiring patterns are soldered to the terminals 82 at the connection points where the lead wires 12, 14 and taps 16 have been soldered. Unwanted portions of the reed frames are then cut off, and in this way the construction of delay line device such as shown in FIG. 2 is realized.

However, the above-described conventional construction wherein the plurality of cores 50 are connected together through the lead wires of the coils 10, is disadvantageous in that the fact that it includes the elongated taps 16 and the lead wires 12, 14 at the input and output ends, makes it very difficult to automate the operation of soldering the elongated taps 16 and lead wires 12, 14; thus, it has heretofore been the practice that such troublesome soldering operation is manually performed, resulting in a low productivity.

As viewed process-wise, the prior art is also disadvantageous not only in that the steps of achieving the connection between the printed circuit board and the lead frames are complicated, but also in that the sheet 40 is required for positioning the cores. Another disadvantage is such that it is likely that since the capacitors 20 are mounted onto the surface of the flat printed ciruit board 30, the positions where the capacitors 20 are to be mounted, tend to be deviated during the step of soldering the capacitors 20 to the printed wiring patterns, and short-circuiting tends to be caused by flow of solder.

SUMMARY OF THE INVENTION

It is an object of the present invention to provide a delay line device which is readily adaptable for automation of the assembling steps thereof, and a method of making such a delay line device.

Another object of the present invention is to provide a delay line device wherein during coil winding operation, taps and input and output end lead wires of the coils are fixed to electrodes to prevent occurrence of elongated wire portions extending from the coils so that assembling and connecting procedures are facilitated.

Yet another object of the present invention is to provide a delay line device wherein capacitors are separated from each other by partition walls of a base plate so that the capacitors can be mounted precisely and stably at predetermined positions, and occurrence of short-circuit can be positively avoided.

A further object of the present invention is to provide a method of making a delay line device, wherein no printed circuit board such as that used in the prior-art method, is employed; and a base plate is molded with a conductor plate having connection portions and terminal portions being buried therein whereby the troublesome step of connecting the printed circuit board to a lead frame as in the prior-art method, is eliminated.

Other objects, features and advantages of the present invention will become apparent from the ensuing description taken in conjunction with the accompanying drawings.

BRIEF DESCRIPTION OF THE DRAWINGS

FIG. 4 is a perspective view, partly cut off, showing the construction of the delay line device assembled according to the first embodiment of the present invention.

FIG. 5 is a sectional view taken along the lines A-A' of FIG. 7.

FIGS. 6 to 9 are views useful for explaining the steps of making the present delay line device.

FIGS. 6 and 7 are bottom plan views, partly cut off.

FIGS. 8 and 9 are top plan views, partly cut off.

FIG. 10 is an enlarged sectional elevational view showing an example of core according to this invention.

DESCRIPTION OF THE PREFERRED EMBODIMENTS

Figure 1:
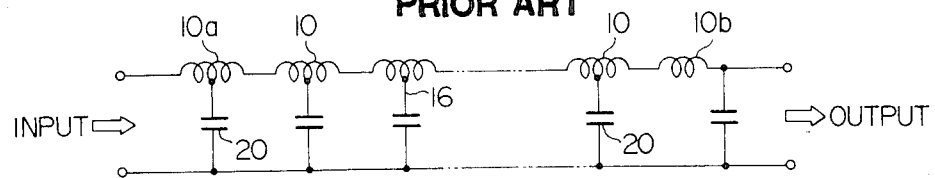
FIG. 1 is a circuit diagram showing an example of delay line device.
Figure 2:
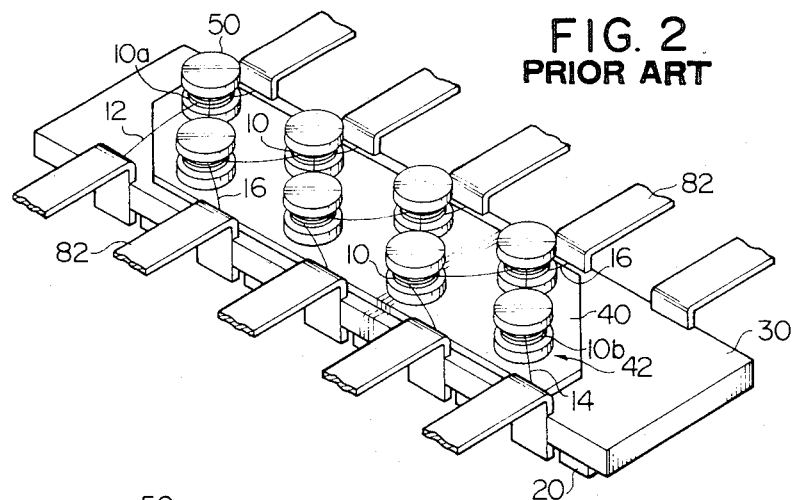
FIG. 2 is a perspective view, partly cut off, showing the construction of a conventional delay line device.
Figure 3:
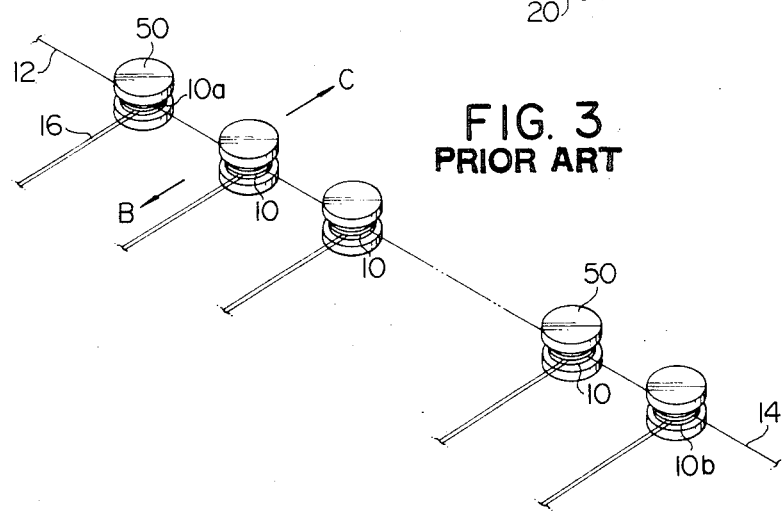
FIG. 3 is a perspective view showing conventional cores each having a coil wound thereon.

Referring to FIGS. 4 to 10, there is shown the delay line device according to an embodiment of the present invention, wherein parts corresponding to FIGS. 1 to 3 are indicated by like reference numerals.

Figure 4:
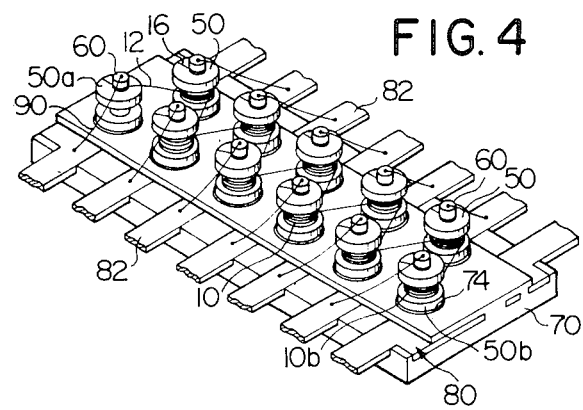
FIGS. 4 to 10 illustrate a first embodiment of the present invention.
Figure 5:
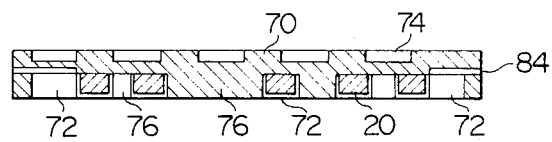
Figure 7:
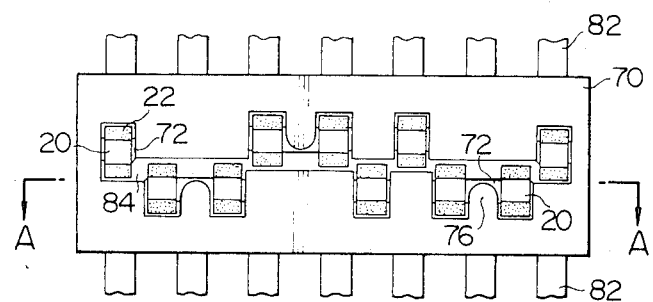
Figure 8:
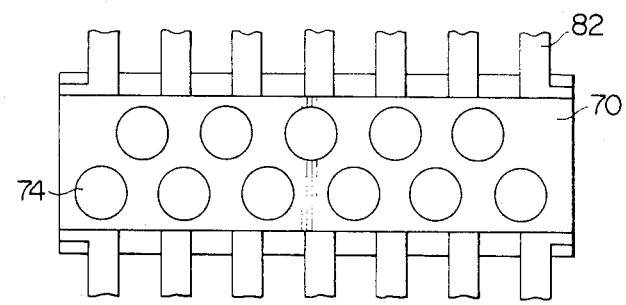
Figure 9:
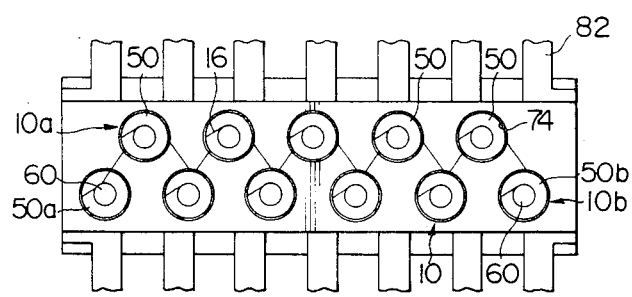

FIG. 4 shows, in a perspective view, like FIG. 2, the construction of the delay line, prior to encapsulation with a plastic material except for terminals. FIG. 5 shows, in a sectional view, a base plate 70 having capacitors mounted thereon, and FIG. 7 is a bottom plan view thereof. The base plate 70, which is formed of a plastic material, is provided, in an embedded manner, with a plurality of conductor plates 80 comprising integral terminals 82 and connection portions 84. The respective terminals 82 extend out of the opposite side faces of the base plate 70, and the connecting portions are exposed at recesses 72 formed in the bottom surface of the base plate 70. Chip-type capacitors 20 are accommodated in the recesses 72 respectively, and have their electrodes 22 soldered to the connection portions 84, as shown in FIG. 7. Furthermore, dents 74 are formed in the top surface of the base plate 70, as shown in FIG. 8, the dents 74 being slightly larger in diameter than the cores 50. As shown in FIG. 9, the cores 50 have their bottom portions inserted in the dents 74 and fixed therein, respectively.

Figure 10:
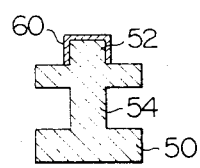

Referring to FIG. 10, there is shown, in an enlarged view, an example of core 50, which comprises a projection 52 provided at one end thereof and extending axially of the coil, and cap-like electrode 60 formed of a conductive material and fitted on the projection 52. Coil wire is wound, several turns, onto drum portion 54 of the core 50a at the input end, then wound onto the electrode 60, and successively wound onto the cores 50, so that a plurality of coils 10 are formed. It is to be noted that the core 50a at the input end is a dummy core which does not constitute a coil but serves to securely retain the input end terminal of the coil, and the electrode 60 thereof serves as input electrode to which the input lead wire 12 is connected. Thus, it is possible that the step of winding the coil wire onto the drum portion 54 of the core 50a may be omitted and the winding operation may be started with the electrode 60. Therefore, the core 50a may include no drum portions 54, unlike the other cores 50, and simply should have substantially the same shape as the remaining cores 50.

The coils 10, except for the coil 10b at the ouput end, are wound onto the drum portions 54 of the respective cores 50; in the course of the winding operation, those coils 10 are upwardly guided and wound onto the electrodes 60 so that the taps 16 are led out; and thereafter, the coils 10 are again wound onto the drum portions 54. In the case of construction such as shown in FIG. 1, the coil 10b at the output end requires no tap; thus, after having been wound onto the drum portion 54 of the core 50b at the output end, the coil wire is upwardly guided, wound onto the electrode 60 thereof to be securely retained thereat, and then severed. In this way, the electrode 60 of the core 50a at the input end serves as lead electrode for the coil 10a at the input end, and the electrode 60 of the core 50b at the output end serves as lead electrode for the coil 10b at the output end. These electrodes 60 are connected to the terminals 82 through wires 90 covered with polyurethane or the like.

Figure 6:
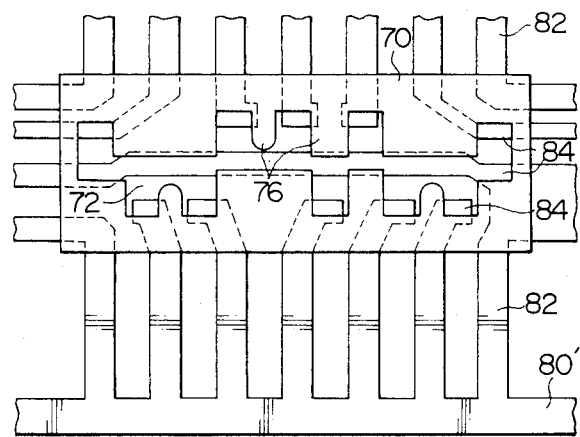
Figure 11:
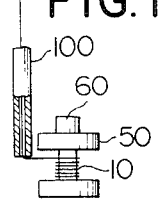
FIG. 11 is a view useful for explaining how a coil is wound onto the core.

An example of the method of making the delay line device according to the present invention will now be explained with reference to the drawings. As shown in FIG. 6, a lead frame 80' is prepared by stamping a conductor plate in accordance with a predetermined pattern, and then a plastic base plate 70 is molded with the lead frame 80' being buried therein. In this case, the base plate 70 is formed, in the top and bottom surfaces thereof, with dents 74, and recesses 72 divided by partition walls 76, respectively, and connecting portions 84 of the lead frame 80' are exposed at the recesses 72, as shown in FIGS. 7 and 8. Subsequently, capacitors 20 are mounted in the recesses 72 in such a manner as to be separated from each other by the partition walls 76; electrodes 22 of the capacitors are soldered to the connecting portions 84; and the cores 50 provided with the electrodes 60 are disposed in the dents 74 of the base plate and fixed therein with a bonding agent or the like Thereafter, for instance as shown in FIG. 11, a wire feeder 100 of an automatic winding machine is first turned around the core 50a at the input end so that the terminal portion of the wire is wound, several turns, onto the drum portion 54 of the core 50a and securely retained thereat, and then the wire is guided upwardly and wound onto the electrode 60 of the core 50a. Then, the wire feeder 100 is moved closer to the neighboring core 50 and turned therearound so that the coil 10 is wound onto the drum portion 54 thereof. In the course of the winding operation, the tap 16 is led out and wound onto the electrode 60, and then the coil 10 is again wound onto the drum portion 54. Similar procedures are repeated so that the coils 10 are wound onto the respective cores 50. After having been wound onto the drum portion 54 of the core 50b at the output end, the coil wire is guided upwardly, wound onto the electrode 60 of the core 50b and retained thereat, and then severed. The coil wire portions wound on the electrodes 60 of the cores 50 are soldered to the electrodes 60, and thereafter, the electrodes 60 are electrically connected to the terminals 82 through wires 90 by means of soldering or welding. In this way, such a delay line device as shown in FIG. 4 is realized. Subsequently, the device is encapsulated with a plastic material, except for the terminals 82, and unwanted portions of the lead frame 80' are cut off; thus, the final product is obtained.

Although in the illustrated embodiment, the coil 10b at the output end had no tap, the invention is equally applicable in the case where the coil 10b has a tap. In that case, the tap of the coil 10b at the output end is connected to the electrode of the core 50b, and the output lead wire thereof is connected to the electrode of another dummy core which is additionally provided at the output side. That is, in addition to a plurality of first cores 50 on which coils are wound contiguously with each other, a second core that is substantially identical in configuration with the first cores, is provided, and the taps, input lead wires, and output lead wires of the respective coils are securely connected to electrodes 60 of those cores.

Figure 12:
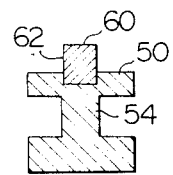
FIG. 12 is a sectional elevational view showing another example of core provided with an electrode according to this invention.
Figure 13:
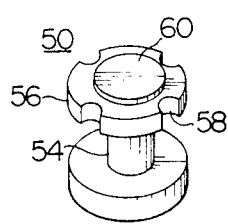
FIG. 13 is a perspective view showing a still another example of core provided with an electrode according to this invention.

In lieu of the aforementioned cap-like electrode 60, cores may be provided with such an electrode 60 as shown in FIG. 12, which comprises a metallic pin 62 which may be embedded in or adhered to one end surface of the core 50 so as to be securely attached thereto. Alternatively, the core may be provided with such a flat electrode as shown in FIG. 13, which can be formed by printing and baking silver paste onto one end surface of the core. In the circumferential surface of that flange of the core on which the electrode is provided, there are formed grooves 58 adapted to permit the tap of the coil wound on the drum portion 54 of the core to be passed therethrough so as to be led out onto the electrode.

In the conventional method wherein elongated tap of each coil is led out during the winding operation of an automatic winding machine, the taps can only be led out in one of such two directions as indicated by arrows B and C in FIG. 3, i.e., in a direction perpendicular to the direction in which the wire portions connection the respective coils extend. In contrast thereto, according to the method of this invention wherein coil winding is performed after cores have been securely mounted on a base plate, no limitation is laid upon the direction in which the taps of the coils can be led out, and it is possible to finely adjust the value of coupling coefficient between the respective coils. Thus, even in the case where it is not possible to locate the resepective cores with such an interval as to achieve optimum coupling therebetween since the coil feeder 100 of the automatic winding machine is caused to pass as shown in FIG. 11, this can be corrected by adjusting the position of each tap.

Figure 14:
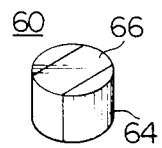
FIG. 14 is a perspective view showing another example of electrode configured in a cap-like form according to this invention.
Figure 15:
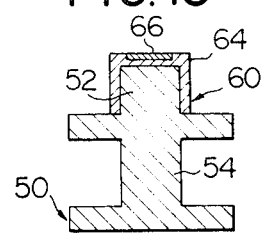
FIG. 15 is a sectional elevational view showing a further example of core having the FIG. 14 electrode fitted thereon according to this invention.

FIG. 14 illustrates another example of cap-like electrode 60, and FIG. 15 shows this electrode as being mounted on a core. This electrode 60 may comprise a clad member consisting of a metal plate, which can be easily soldered, such as copper plate 64, for example, and an aluminum plate 66 securely attached to part of the surface of the copper plate 64. When such electrodes 60 are used, it is possible to automate and speed up the wiring and connecting operation between the electrodes 60 and the terminals 82, by using an aluminum wire and by resorting to ultrasonic wire-bonding technique, for example. In this case, connection of the tap and lead wires 12, 14 of a coil to the associated electrode 60 can be achieved at the copper plate 64 by means of dip-soldering or the like, and connection between the electrode 60 and the aluminum wire can be effected at the aluminum plate 66 by means of ultrasonic wire-bonding technique or the like. Although in the illustrated embodiment, a copper plate was used as base metal, it is also possible that an aluminum plate may be employed in lieu of the copper plate.

Figure 16:
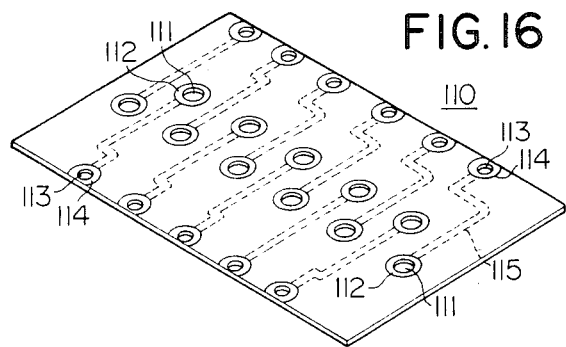
FIG. 16 is a perspective view showing an example of flexible printed circuit board.

Connection between the electrodes 60 and the terminals 82 may be made by using a flexible printed circuit board provided with a plurality of printed wiring patterns, instead of the individual wires 90. Referring to FIG. 16, there is shown an example of such flexible printed circuit board 110, which is formed with apertures 111 at the positions corresponding to electrodes 60, and provided, around the apertures 111, with electrodes 112 on the opposite surfaces thereof, the electrodes 112 being connected together through through-hole conductors. The flexible printed circuit board 110 is also formed with second apertures 113 at the positions corresponding to the terminals 82, and provided, around the apertures 113, with electrodes 114 on the opposite surfaces thereof, the electrodes 114 being also connected together through through-hole conductors. The electrodes 112 and 114 are paired and connected to each other through printed wiring patterns 115. The second apertures 113 may be omitted if the printed wiring patterns 115 can be connected to the terminals 82 by any other means.

Figure 17:
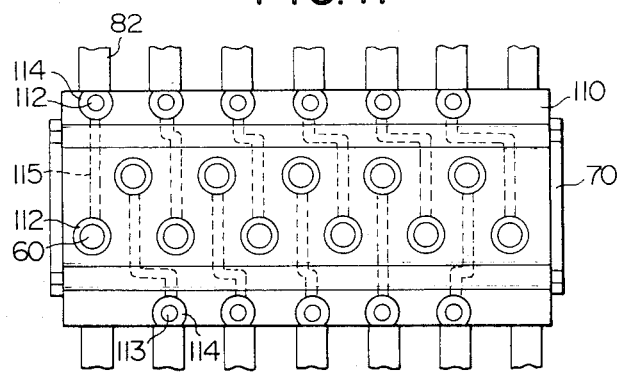
FIG. 17 is a plan view illustrating the manner in which the flexible printed circuit board is incorporated in the present delay line device.
Figure 18:
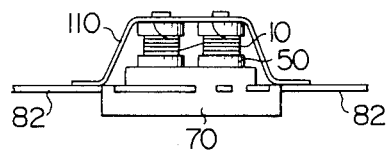
FIG. 18 is a side view of FIG. 17.

After the taps 16 and lead wires 12, 14 have been soldered to electrodes 60, the latter are inserted in the apertures 112 respectively, and the flexible printed circuit board 110 is mounted, in a curved fashion, onto the base plate 70, as shown in FIGS. 17 and 18. The electrodes 112 are soldered to the electrodes 60 respectively, and the electrodes 114 are soldered to the terminals 82 respectively. In the case where the electrodes 60 are flat, too, the flexible printed circuit board can be applied in a similar manner, except that the electrodes 60 are not inserted in the apertures 112. By using a flexible printed circuit board, it is possible to connect all the taps and lead wires 12, 14 to the corresponding terminals 82 at one stroke with the aid of an automatic winding machine. For such an arrangement that wiring patterns connecting the taps 16 to the terminals 82 cross each other, too, the desired connection can be achieved simply by using a double-faced flexible printed circuit board provided with crossing printed wiring patterns 115.

The aforementioned dummy core may be omitted in the case where no flexible printed circuit board or wire-bonding technique is used to connect the electrodes 60 to the terminals 82.

According to the present invention, since coils are wound onto cores after the latter have been securely mounted onto a base plate, it is possible to avoid the troublesome step of mounting coils with cores connected together through the coils, onto the base plate as in the prior art. Furthermore, in the present invention, no printed circuit board is used, and the base plate is directly insert-molded with respect to a reed frame, so that no step of connecting the printed circuit board to the reed frame as in the prior art, is involved in the method of the present invention.

Still furthermore, according to the present invention, the taps, input lead wires and output lead wires of the coils are securely attached to the electrodes while the coils are being wound onto the cores, and thus there are no wires extending in random directions from the coils connected together, whereby the assembling and connecting procedures are greatly simplified.

As will be appreciated from the foregoing discussion, according to the present invention, the steps of combining the reed frame and base plate together, mounting the cores onto the base plate, winding the coils, and connecting the taps to the terminals can be performed accurately and rapidly with the aid of an automatic machine, so that a greatly enhanced productivity can be realized.

While the present invention has been illustrated and described with respect to specific embodiments thereof, it is to be understood that the present invention is by no means limited thereto but covers all changes and modifications which will become possible within the scope of the appended claims.

I claim:

1. A lumped constant type delay line device wherein a plurality of cores having coils contiguously wound thereon, are mounted on a plastic base plate, characterized in that said plastic base plate is molded with a plurality of conductor plates each integrally provided with connecting portions and terminals being buried therein in such a manner that said connecting portions are exposed at one surface of said base plate and said terminals extend externally thereof; capacitors are securely connected to said connecting portions; coils are mounted on the other surface of said base plate, said coils having taps thereof connected to electrodes provided on the top end surfaces of the cores respectively; and said electrodes are electrically connected to said terminals respectively.

2. A delay line device according to claim 1, wherein each of said electrodes is connected to a corresponding one of said terminals through a wire respectively.

3. A delay line device according to claim 1, wherein said connecting portions are exposed at receses formed in one surface of said base plate, each of said recesses being divided by partition walls; and said capacitors are provided in said recesses in such a manner as to be separated from each other by said partition walls.

4. A delay line device according to claim 1, wherein a second core (dummy core) which is substantially identical in configuration with said cores, is mounted on said plastic base plate; an electrode is provided at the top of said second core; and said coils have their input or output lead wires connected to said electrode.

5. A delay line device according to claim 4, wherein each core is provided with a pair of flanges, and each of said electrodes is provided in such a manner as to extend axially of the coil from one of the flanges of the core.

6. A delay line device according to claim 1, wherein two second cores (dummy cores) which are substantially identical in configuration with said cores, are mounted on said plastic base plate; an electrode is provided at the top of each of said second cores; and said coils have their input and output lead wires connected to the electrodes of said two second cores respectively.

7. A delay line device according to claim 6, wherein each core is provided with a pair of flanges, and each of said electrodes is provided in such a manner as to extend axially of the coil from one of the flanges of the core.

8. A delay line device according to claim 1, wherein said electrodes are provided in a flat form on the top of said cores respectively.

9. A delay line device according to claim 8, wherein said electrodes and said terminals are connected to conductors mounted on a flexible printed circuit board.

10. A delay line device according to claim 9, wherein said flexible printed circuit board is provided with a plurality of apertures and a plurality of printed wiring patterns; and said electrodes are inserted in said apertures respectively; and said electrodes and said terminals are connected to each other through said printed wiring patterns respectively.

11. A delay line device according to claim 1, wherein each core is provided with a pair of flanges, and each of said electrodes is provided in such a manner as to extend axially of the coil from one of the flanges of the core.

12. A delay line device according to claim 11, wherein each of said electrodes comprises a conductive pin securely attached to one end of the associated core.

13. A delay line device according to claim 11, wherein each of said electrodes is configured in the form of a conductive cap which is fitted on a projecting portion of the associated core.

14. A delay line device according to claim 13, wherein each of said cap-like electrodes is formed by a clad member comprising a metal plate having an improved soldering property, and an aluminum plate.

15. A delay line device according to claim 14, wherein each of said cap-like electrodes is formed by a clad member comprising a copper plate and an aluminum plate.

16. A method of making a lumped constant type delay line device, comprising the steps of:
molding a plastic base plate with a lead frame having integral connecting portions and terminals being buried therein in such a manner that said connecting portions are exposed at one surface thereof and said terminals extend externally thereof;
securely connecting capacitors to said connecting portions;
mounting cores securely onto the other surface of said base plate, and thereafter, continuously winding coil wire onto the cores, while taps which are connectable to electrodes provided at the top of the respective cores, are being led out, one end portion of said core wire being adapted to serve as an input terminal, the other end portion of said coil wire being adapted to serve as an output terminal;
soldering the taps to the electrodes respectively;
electrically connecting the terminals of the lead frame to the electrodes respectively; and
severing unwanted portions of said lead frame.

17. A method of making a delay line device according to claim 16, further comprising the steps of connecting, by soldering, the input and output terminals of the coils to the electrodes of the cores, and electrically connecting the electrodes to the terminals of the lead frame.

18. A method of making a delay line device according to claim 16, wherein each of said electrodes is formed by printing and baking silver paste onto the top of the associated core.

19. A method of making a delay line device according to claim 18, wherein each tap is wound onto the associated electrode and soldered thereto.

20. A method of making a delay line device according to claim 16, wherein each of said electrodes is formed by a cap-like conductor member fitted on the top portion of the associated core.

21. A method of making a delay line device according claim 20, wherein each tap is wound onto the associated electrode and soldered thereto.

* * * * *